United States Patent [19]

Okano et al.

[11] Patent Number: 5,103,167
[45] Date of Patent: Apr. 7, 1992

[54] INTEGRATED CIRCUIT DEVICE PROVIDED WITH TEST MODE FUNCTION

[75] Inventors: Nobuhiro Okano, Nara; Hiroshi Uemura, Soraku; Eiji Ogino, Tenri, all of Japan

[73] Assignee: Sharp Kabushiki Kaisha, Japan

[21] Appl. No.: 571,852

[22] Filed: Aug. 24, 1990

[30] Foreign Application Priority Data

Aug. 31, 1989 [JP] Japan .................................. 1-225927

[51] Int. Cl.⁵ .......................................... G01R 31/28
[52] U.S. Cl. ................................ 324/158 R; 371/22.1; 371/22.5
[58] Field of Search ........................ 324/158 R, 158 T; 371/15.1, 25.1, 22.5, 22.6, 22.1

[56] References Cited

U.S. PATENT DOCUMENTS

| 4,743,841 | 5/1988 | Takeuchi ......................... 324/158 R |
| 4,816,757 | 3/1989 | Hutchins ......................... 324/158 R |

FOREIGN PATENT DOCUMENTS

3727723A1 3/1988 Fed. Rep. of Germany .

Primary Examiner—Ernest F. Karlsen
Attorney, Agent, or Firm—Nixon & Vanderhye

[57] ABSTRACT

An integrated circuit device provided with test mode function has a plurality of terminals used for receiving and/or feeding out signals during a normal operation of the device. At least one terminal of the plurality of terminals are connected to a register for storing test mode setting data applied through the at least one terminal during a reset cycle period of the device. In accordance with the test mode setting data stored in the register, a setting of a predetermined test mode of the device is executed.

8 Claims, 3 Drawing Sheets

WRITING PERIOD IN REGISTER (THREE CLOCKS)

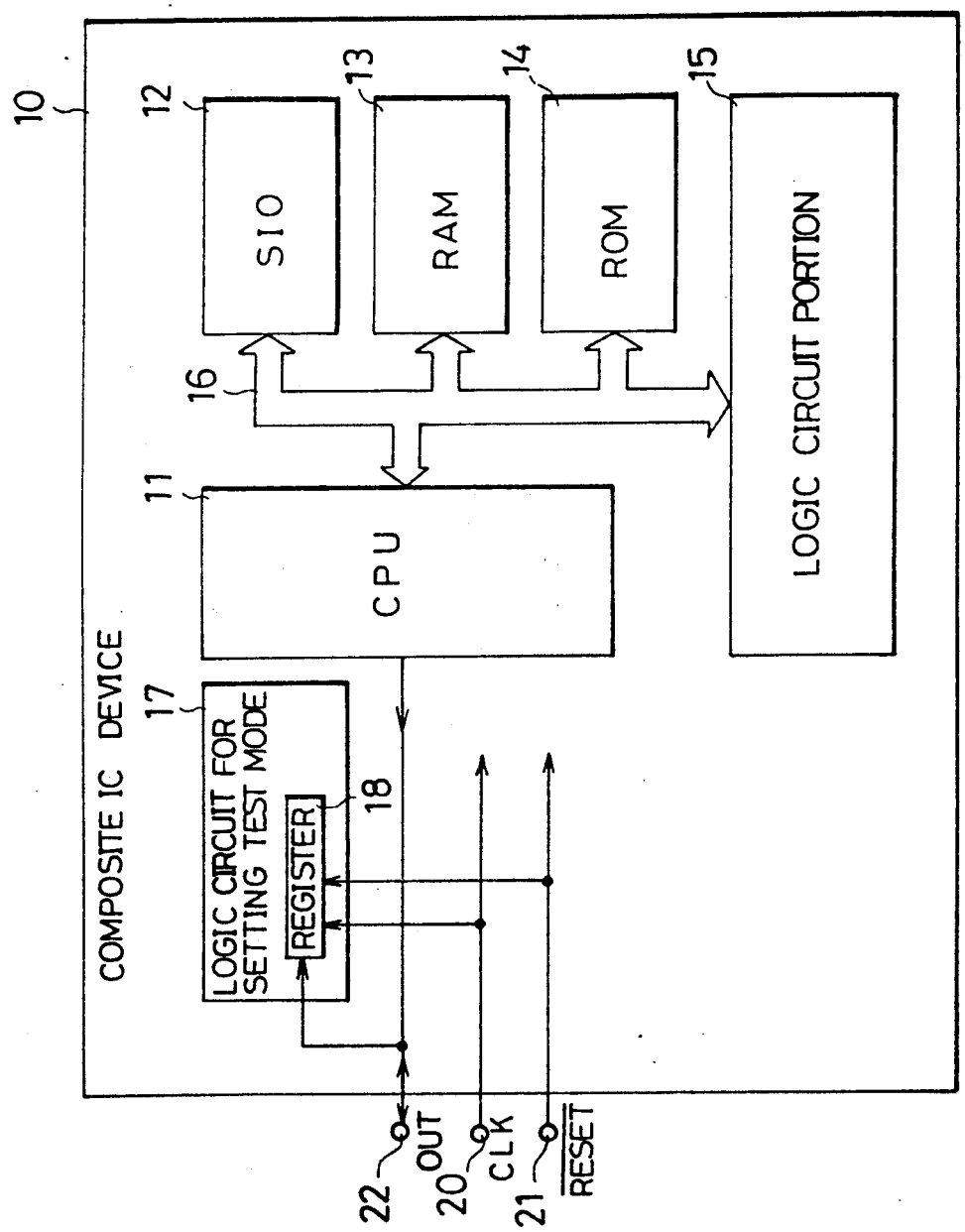

INTEGRATED CIRCUIT DEVICE PROVIDED WITH TEST MODE FUNCTION

BACKGROUND OF THE INVENTION

1. Field of the Invention

The present invention relates to a composite integrated circuit device having test mode function.

2. Description of the Related Art

For testing a composite integrated circuit (IC) device, normally, it has been necessary to additionally arrange at least one exclusive terminal for inputting test mode setting data (referred as test terminal) to the IC device in addition to normal input terminals and output terminals, or normal input/output terminals. Such normal input terminals and output terminals, or normal input/output terminals are served to receive and/or feed out signals during normal operating condition of the IC device.

The test terminal is used only for receiving test mode setting data. The test modes are executed in response to the inputted test mode setting data by separating function blocks, for example central processing unit (CPU), memories, logic circuits, and the like, built in the composite IC device from each other. In other words, the conventional composite IC device has at least one additional exclusive test terminal never used for normal operation of the IC device.

Such IC device provided with at least one additional exclusive terminal for receiving test mode setting data has an advantage that it is possible to freely determine the constitution of a signal and a circuit for setting each test mode so far as how to properly couple each of the function blocks for the normal operation is considered. However, since the composite IC device becomes more complicated and functional, a greater number of test modes are required causing the number of additional exclusive terminals for inputting test mode setting data to greatly increase.

Recently, the composite IC device, referred to as a CPU core formed by modifying an existing CPU, is likely to be kept more functional and complicated in a system-on-chip manner. So, such IC device keeps more terminals accordingly.

In order to cope with such the tendency, following disadvantages have to be overcome.

(1) The net manufacturing cost is increased as the terminals become more in number.

(2) Since the terminals dedicated for the normal operation become more in number, the area of a package restricts an upper limit number of test terminals.

(3) By studying the combination of "0" and "1" inputted into the test terminals for inputting test mode setting data, the content (program or data) stored in the memories of the composite IC device may be easily decoded by a third person. This is problematic in light of protecting software.

SUMMARY OF THE INVENTION

It is therefore an object of the present invention to provide an integrated circuit device provided with test mode function, which is capable of testing each function block therein without arranging any additional terminal used only for receiving test mode setting data.

According to the present invention, the above-mentioned object can be achieved by an integrated circuit device provided with test mode function, which device includes a plurality of terminals used for receiving and/or feeding out signals during a normal operation of the device. At least one terminal of the plurality of terminals are connected to a register for storing test mode setting data applied through the at least one terminal during a reset cycle period of the device. In accordance with the test mode setting data stored in the register, a setting of a predetermined test mode of the device is executed.

During a reset cycle period of a central processing unit (CPU) in the integrated circuit device, the plurality of terminals are kept in high impedance and thus separated from the other circuit in the integrated circuit device. Therefore, during the reset cycle period, the test mode setting data can be received by terminals which are used for receiving and/or feeding out signals when the normal operation of the CPU is carried out. The received test mode setting data is stored in the register.

As a result, without arranging additional test terminal, setting of the test modes can be executed.

It is preferred that the plurality of terminals are directly connected to the CFU.

Preferably, the plurality of terminals are a plurality of input terminals used for receiving input signals.

The plurality of terminals may be a plurality of output terminals used for feeding out output signals.

The register may include a plurality of serially connected flip-flops and an AND gate. The number of the flip-flops is equal to a predetermined number of bits of the test mode setting data.

Further objects and advantages of the present invention will be apparent from the following description of the preferred embodiments of the invention as illustrated in the accompanying drawings.

BRIEF DESCRIPTION OF THE DRAWINGS

FIG. 4 is a block diagram illustrating an another embodiment of a composite integrated circuit device according to the present invention.

DESCRIPTION OF THE PREFERRED EMBODIMENTS

Figure 1:
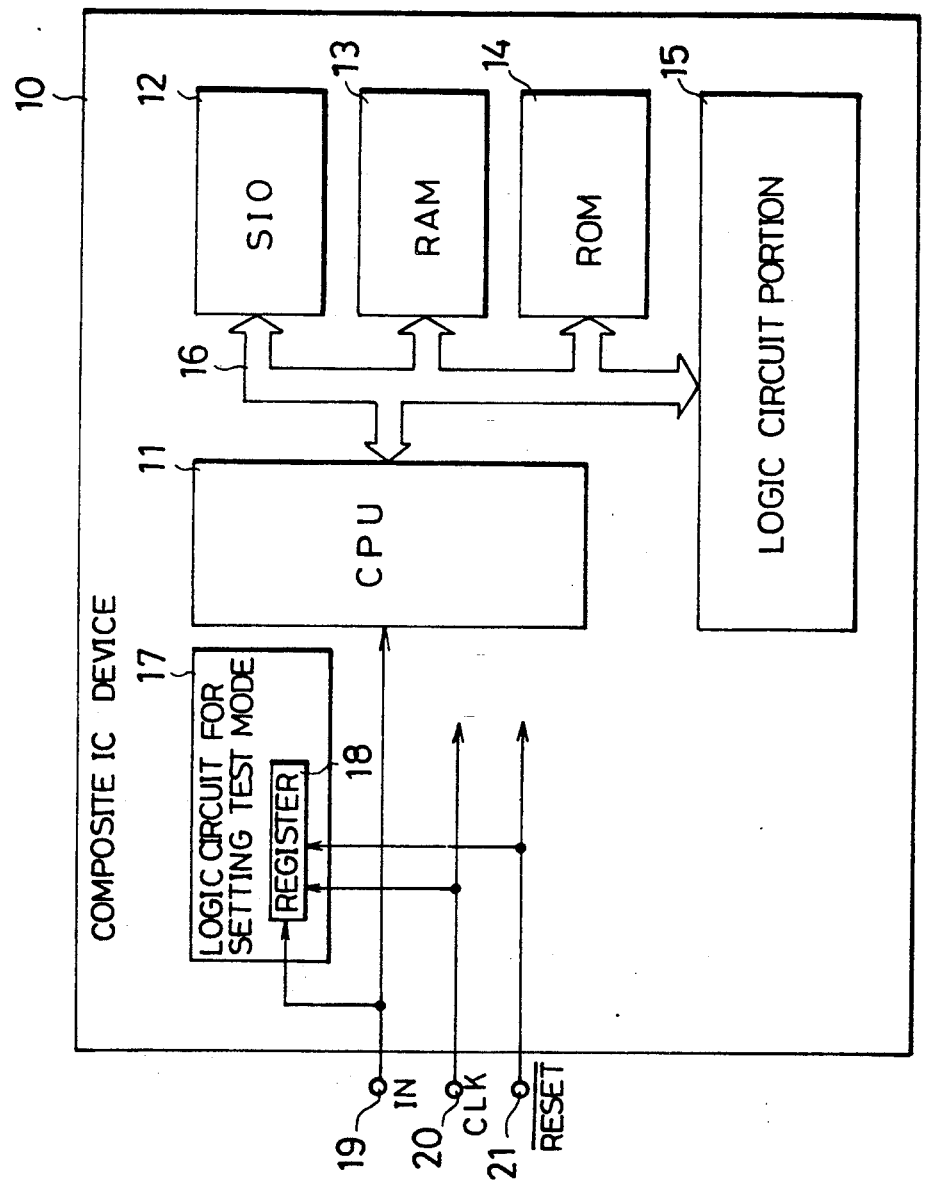
FIG. 1 is a block diagram illustrating a preferred embodiment of a composite integrated circuit device according to the present invention.

FIG. 1 illustrates a preferred embodiment of the present invention. Referring to FIG. 1, a composite integrated circuit (IC) device 10 provided with test mode function has a central processing unit (CPU) 11, a serial input/output device (SIO) 12, a random access memory (RAM) 18, a read only memory (ROM) 14, and a logic circuit portion is, which are connected with each other by means of a bus 16.

The IC device 10 further has a logic circuit 17 for setting test mode. This test mode logic circuit 17 has a register 18 for storing a test mode setting data of for example three bits. The register 18 is connected to an input terminal 19 of the IC device 10, for receiving an input signal (IN) during a reset cycle period. This input terminal 19 is directly connected to a terminal of the CPU 11 so as to directly feed the received input signal (IN) to the CPU 11. The above-mentioned terminal of the CPU II may be a terminal for receiving an interrupt request signal (INT), a terminal for receiving a non maskable interrupt signal (NMI), a terminal for receiving a wait signal (WAIT), or a terminal for receiving a bus request signal (BUSRQ). The register 18 is further connected to a clock signals (CLK) input terminal 20 and to a reset signal (RESET) input terminal 21 of the IC device 10.

Figure 2:
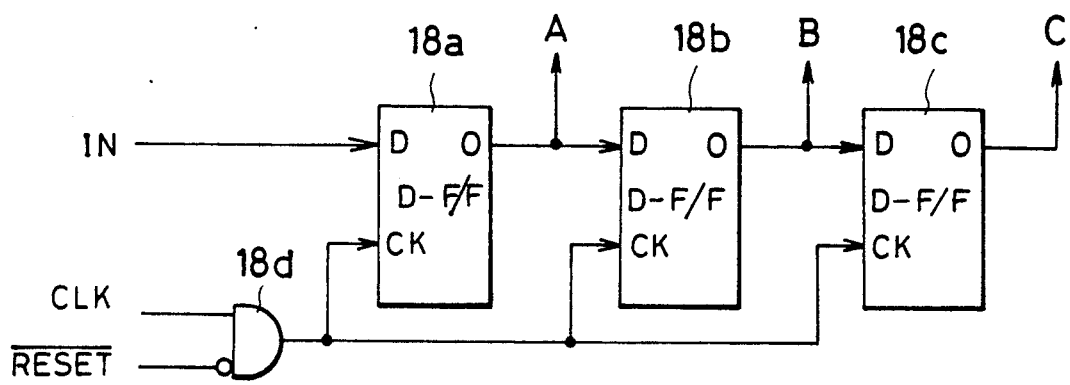
FIG. 2 is a diagram illustrating arrangement of a register shown in FIG. 1.

FIG. 2 shows detail constitution of the register 18. As illustrated in FIG. 2, the register 18 mainly consists of three serially connected D-type flip-flops 18a to 18c which respectively store three bits A, B, and C of the test mode setting data, and an AND gate 18d. Input terminals of the AND gate 18d are connected to the clock input terminal 20 and to the reset signal input terminal 21 and an output terminal thereof is connected to each clock input terminal (CK) of the flip-flops 18a to 18c. An input terminal of the first flip-flop 18a is connected to the input terminal 19 of the IC device 10. The constitution of the register 18, however, can be optionally arranged.

The test mode logic circuit 17 executes setting of a test mode in accordance with the test mode setting data of three bits A, B, and C, which data is inputted during a reset cycle period through the input terminal 19 and stored in the register 18.

Figure 3:
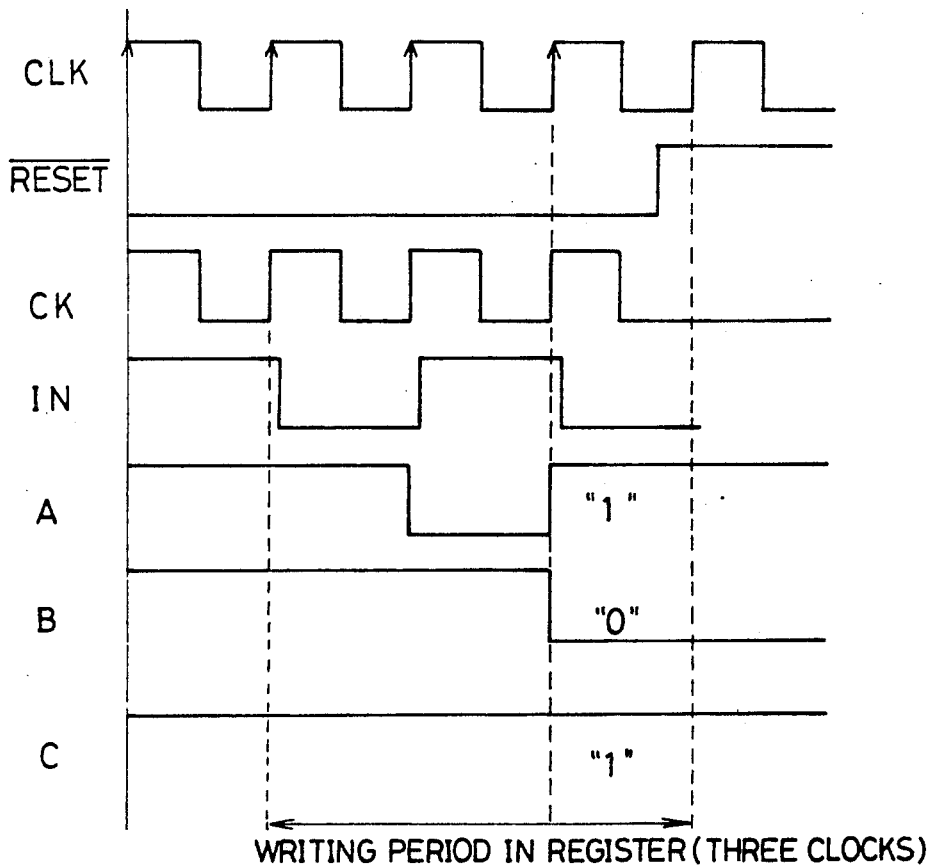
FIG. 3 is a timing chart of various signals in the register shown in FIG. 2.

FIG. 3 shows a timing chart of various signals in the register 18. As illustrated in FIGS. 2 and 3, since the AND gate 18d is opened clock signals (CLK) are applied to the clock input terminals (CK) of the flip-flops 18a to 18c during the reset cycle period. Therefore, an input signal (IN) applied via the input terminal 19 of the IC device 10 in a writing period of three clocks during the reset cycle period is stored in the flip-flops 18a to 18c as a test mode setting data. Since some input terminals directly connected to terminals of the CPU 11, such as the input terminal 19, are kept in high impedance and separated from the other circuit in the IC device 10 during this reset cycle period, these input terminals can be utilized as terminals for inputting test mode setting data. During a set cycle period, namely during the normal operation, as the AND gate 18d is closed, the register 18 is separated from the input terminal 19.

In case of FIG. 5, the test mode setting data is "1, 0, 1" for setting a predetermined test mode.

If the input terminal 19 for applying the test mode setting data is a terminal employing normally high-level (1) signal such as the interrupt request signal (INT), the non maskable interrupt signal (NMI), the wait signal (WAIT), or the bus request signal (BUSRQ), data of "0, 0, 0" to "1, 1, 0" are used for indicating respective test modes to be set and the remaining data of "3, 1, 1" is used for indicating normal operation mode. On the other hand, if the input terminal 19 for applying the test mode setting data is a terminal employing normally low-level (0) signal, data of 0, 0, 1" to are used for indicating respective test modes to be set and the remaining data of "0, 0, 0" is used for indicating normal operation mode.

The bit number of the register 18 can be properly selected in accordance with the number of the test modes to be set. The number of the test modes to be set can be further increased by using a plurality of input terminals for inputting the test mode setting data.

A password for protecting secrets can be added to the test mode setting data because the number of input terminals for inputting the test mode setting data and the bit number of the register 18 can be freely set.

FIG. 4 illustrates an another embodiment of the present invention. In this embodiment, the register 18 is not connected to an input terminal of the IC device 10 but connected to an output terminal 22 oof the IC device 10, for feeding out an output signal (OUT). This output terminal 22 is directly connected to a terminal of the CPU 11 so as &o directly feed out the output signal (OUT) from the CPU 11. The above-mentioned terminal of the CPU 11 may be a terminal for feeding put an halt state signal (HALT), a terminal for feeding out a memory request signal (MREQ), a terminal for feeding out an input/output request signal (IORQ), a terminal for feeding out a memory write signal (WR), a terminal for feeding out a memory read signal (RD), or a terminal for feeding out a bus acknowledge signal (BUSAK).

Namely, in the embodiment of FIG. 4, an input signal applied via the output terminal 22 of the IC device 10 in a writing period of three clocks during the reset cycle period is stored in the register 8 as a test mode setting data. The other constitution and operation of this embodiment are the same as these of the embodiment of FIG. 1.

Instead of the input terminal or the output terminal, an input/output terminal directly connected to a terminal of the CPU 11 may be used as a terminal for inputting a test mode setting data during a writing period.

Many widely different embodiments of the present invention may be constructed without departing from the spirit and scope of the present invention. It should be understood that the present invention is not limited to the specific embodiments described in specification, except as defined in the appended claims.

What is claimed is:

1. An integrated circuit device provided with test mode function comprising:
   a plurality of terminals used for receiving and/or feeding out signals during a normal operation of said device;
   a reset terminal for receiving a reset signal applied thereto during a reset cycle period of said device; and
   a register means disposed in said device and connected to at least one predetermined terminal of said plurality of terminals and to said reset terminal, for storing test mode setting data applied through said at least one predetermined terminal, said register means having means for allowing said register to store said test mode setting data into said register means only when the reset signal is applied through said reset terminal.

2. An integrated circuit device as claimed in claim 1, wherein said plurality of terminals are kept in high impedance during the reset cycle period of said device.

3. An integrated circuit device as claimed in claim 1, wherein said device includes a central processing unit and said plurality of terminals are directly connected to said central processing unit.

4. An integrated circuit device as claimed in claim 3, wherein said plurality of terminals are a plurality of input terminals used for receiving input signals.

5. An integrated circuit device as claimed in claim 3, wherein said plurality of terminals are a plurality of output terminals used for feeding out output signals.

6. An integrated circuit device as claimed in claim 1, wherein said register has a capacity for spring the test mode setting data having a predetermined number of bits.

7. An integrated circuit device as claimed in claim 6, wherein said register includes a plurality of serially connected flip-flops and an AND gate, the number of said flip-flops being equal to said predetermined number of bits of said register.

8. An integrated circuit device as claimed in claim 1, wherein said means for allowing of said register includes an AND gate having at least two inputs, one of which is connected to said reset terminal so as to allow storing of said test mode setting data into said register means in response to the reset signal.

* * * * *